United States Patent
Muendel et al.

(10) Patent No.: US 10,305,252 B2
(45) Date of Patent: May 28, 2019

(54) LASER SYSTEM AND METHOD OF TUNING THE OUTPUT POWER OF THE LASER SYSTEM

(71) Applicants: Lumentum Operations LLC, Milpitas, CA (US); Amada Holdings Company LTD., Kanagawa (JP)

(72) Inventors: Martin H. Muendel, Oakland, CA (US); Justin L. Franke, Milpitas, CA (US); Joseph J. Alonis, Palo Alto, CA (US); Kaori Usuda, Kanagawa (JP); Minoru Ogata, Kanagawa (JP)

(73) Assignees: Lumentum Operations LLC, Milpitas, CA (US); AMADA HOLDINGS COMPANY LTD., Isehara (JP)

( * ) Notice: Subject to any disclaimer, the term of this patent is extended or adjusted under 35 U.S.C. 154(b) by 0 days.

(21) Appl. No.: 15/510,870

(22) PCT Filed: Oct. 8, 2015

(86) PCT No.: PCT/US2015/054713
§ 371 (c)(1),
(2) Date: Mar. 13, 2017

(87) PCT Pub. No.: WO2016/060933
PCT Pub. Date: Apr. 21, 2016

(65) Prior Publication Data
US 2017/0279246 A1 Sep. 28, 2017

(30) Foreign Application Priority Data
Oct. 15, 2014 (JP) .................. 2014-210491

(51) Int. Cl.
*H01S 5/40* (2006.01)
*H01S 5/042* (2006.01)
(Continued)

(52) U.S. Cl.
CPC .......... *H01S 5/0427* (2013.01); *B23K 26/064* (2015.10); *B23K 26/0608* (2013.01);
(Continued)

(58) Field of Classification Search
CPC ........ H01S 5/0683; H01S 3/131; H01S 5/042; H01S 5/4012; H01S 5/4025
See application file for complete search history.

(56) References Cited

U.S. PATENT DOCUMENTS

| 4,439,861 A | 3/1984 | Bradford |
| 5,337,325 A * | 8/1994 | Hwang ................ G02B 6/04 372/36 |

(Continued)

FOREIGN PATENT DOCUMENTS

| CN | 201113219 Y | 9/2008 |
| CN | 101449401 A | 6/2009 |

(Continued)

OTHER PUBLICATIONS

International Search Report and Written Opinion corresponding to PCT/US2015/054713 dated Dec. 28, 2015, 12 pages.

(Continued)

*Primary Examiner* — Yuanda Zhang
(74) *Attorney, Agent, or Firm* — Harrity & Harrity, LLP

(57) ABSTRACT

A power control method for a laser system comprising laser diodes arranged in diode banks is provided. Each diode bank comprises at least one of the laser diodes and has a maximum power. The method comprises operating a first diode bank of the diode banks to output a first power; and concurrently operating other of the diode banks to output other powers, at least one of the other powers being different than the first power.

40 Claims, 6 Drawing Sheets

(51) Int. Cl.
*H01S 5/0683* (2006.01)
*H01S 5/00* (2006.01)
*B23K 26/70* (2014.01)
*H01S 3/131* (2006.01)
*B23K 26/06* (2014.01)
*B23K 26/08* (2014.01)
*B23K 26/362* (2014.01)
*B23K 26/38* (2014.01)
*B23K 26/064* (2014.01)
*H01S 5/022* (2006.01)
*H01S 5/024* (2006.01)
*H01S 5/06* (2006.01)
*H01S 5/14* (2006.01)

(52) U.S. Cl.
CPC ...... *B23K 26/0613* (2013.01); *B23K 26/0876* (2013.01); *B23K 26/362* (2013.01); *B23K 26/38* (2013.01); *B23K 26/702* (2015.10); *B23K 26/703* (2015.10); *H01S 3/131* (2013.01); *H01S 5/0071* (2013.01); *H01S 5/042* (2013.01); *H01S 5/0683* (2013.01); *H01S 5/4012* (2013.01); *H01S 5/4018* (2013.01); *H01S 5/4025* (2013.01); *H01S 5/4062* (2013.01); *H01S 5/005* (2013.01); *H01S 5/02252* (2013.01); *H01S 5/02423* (2013.01); *H01S 5/0617* (2013.01); *H01S 5/141* (2013.01); *H01S 5/4087* (2013.01)

(56) References Cited

U.S. PATENT DOCUMENTS

| | | | |
|---|---|---|---|
| 5,715,270 A | 2/1998 | Zediker et al. | |
| 5,729,568 A | 3/1998 | Opower et al. | |
| 5,748,654 A | 5/1998 | Marabella et al. | |
| 6,094,447 A * | 7/2000 | Drake, Jr. | H01S 3/0941 372/75 |
| 6,252,893 B1 * | 6/2001 | Stange | H01S 5/06808 372/30 |
| 6,518,563 B1 | 2/2003 | Broutin et al. | |
| 6,856,634 B2 * | 2/2005 | Mikame | B23K 26/0604 372/1 |
| 8,427,749 B2 | 4/2013 | Du et al. | |
| 8,428,092 B2 | 4/2013 | Hayano et al. | |
| 8,488,245 B1 | 7/2013 | Chann et al. | |
| 2001/0026573 A1 | 10/2001 | Takayama et al. | |
| 2001/0030983 A1 | 10/2001 | Yuri et al. | |
| 2001/0033590 A1 | 10/2001 | Yuri et al. | |
| 2002/0064192 A1 | 5/2002 | Missey et al. | |
| 2003/0095736 A1 * | 5/2003 | Kish, Jr. | B82Y 20/00 385/14 |
| 2003/0150842 A1 | 8/2003 | Mikame | |
| 2004/0190566 A1 | 9/2004 | Andersson | |
| 2005/0185684 A1 | 8/2005 | Stewart et al. | |
| 2007/0022939 A1 | 10/2007 | Brown et al. | |
| 2008/0019010 A1 | 1/2008 | Govorkov et al. | |
| 2009/0190218 A1 | 7/2009 | Govorkov et al. | |
| 2010/0103088 A1 | 4/2010 | Yokoyama et al. | |
| 2010/0177797 A1 | 7/2010 | Appleyard et al. | |
| 2011/0305250 A1 | 12/2011 | Chann et al. | |
| 2012/0002395 A1 | 1/2012 | Du et al. | |
| 2012/0165800 A1 | 6/2012 | Keeney et al. | |
| 2012/0213238 A1 | 8/2012 | Hayano et al. | |
| 2012/0253334 A1 | 10/2012 | Liu et al. | |
| 2012/0263202 A1 * | 10/2012 | Steinle | H05B 33/0851 372/38.02 |
| 2012/0269217 A1 * | 10/2012 | Senda | B23K 26/0613 372/38.02 |
| 2013/0010820 A1 * | 1/2013 | Curtis | G02B 27/48 372/23 |
| 2013/0272331 A1 | 10/2013 | Kitagawa et al. | |
| 2013/0293941 A1 | 11/2013 | Harter et al. | |
| 2014/0014858 A1 | 1/2014 | Gattass et al. | |
| 2014/0018858 A1 | 1/2014 | Gattass et al. | |
| 2014/0064317 A1 * | 3/2014 | Honda | H01S 3/09702 372/61 |
| 2014/0219299 A1 * | 8/2014 | Burkholder | H01S 3/09408 372/25 |
| 2014/0245051 A1 | 8/2014 | Itabashi et al. | |
| 2015/0375337 A1 * | 12/2015 | Hayashi | B23K 26/38 219/121.61 |

FOREIGN PATENT DOCUMENTS

| | | |
|---|---|---|
| CN | 101689748 A | 3/2010 |
| CN | 102224606 A | 10/2011 |
| JP | 2683158 B2 | 11/1997 |
| JP | 2001284732 A | 10/2001 |
| JP | 2002335042 A | 11/2002 |
| JP | 2010263063 A | 11/2010 |
| JP | 2012174720 A | 9/2012 |
| JP | 2013197371 | 9/2013 |
| JP | 2013233556 A | 11/2013 |
| JP | 2014093396 A | 5/2014 |
| JP | 2014104479 A | 6/2014 |
| WO | WO 2014133013 | 9/2014 |
| WO | WO2016060933 | 4/2016 |

OTHER PUBLICATIONS

European Search Report corresponding to EP 15851517.1 dated May 17, 2018, 10 pages.
Baik, Jin-Serk, et al. "Polarization and temperature-tolerant wavelength-locked WDM source with external ASE injection." *Lasers and Electro-Optics*,(CLEO), Conference on. vol. 1. IEEE, May 17, 2004, XP010745750, 3 pages.
Extended European Search Report corresponding to EP 15851214.5 dated May 22, 2018, 9 pages.
Search Report issued in WIPO Patent Application No. PCT/JP2015/078877, dated Dec. 28, 2015.

* cited by examiner

LASER SYSTEM AND METHOD OF TUNING THE OUTPUT POWER OF THE LASER SYSTEM

CROSS-REFERENCE TO RELATED APPLICATIONS

This application claims priority to PCT Application No. PCT/US2015/054713, filed Oct. 8, 2015, which claims priority to Japanese Patent Application No. 2014-210491 filed on Oct. 15, 2014, which are incorporated herein by reference.

TECHNICAL FIELD

The present disclosure relates to laser systems and methods of operating laser systems. More particularly, the present disclosure relates to methods and systems for tuning laser output power.

BACKGROUND OF THE DISCLOSURE

Laser systems may incorporate collections of two or more laser diodes either as the direct source of the output laser radiation, or as a pump for a diode-pumped laser such as a fiber laser, a disk laser, a slab laser, a rod laser, a diode-pumped solid-state laser, a Raman laser, a Brillouin laser, an optical parametric laser, or an alkali-vapor laser.

Many laser applications require tunable laser output power from near zero power up to maximum power. In materials-processing applications, for example, low power levels may be required for alignment or pre- or post-treatment steps, whereas high power levels may be used for the actual processing steps such as cutting, welding, drilling, or scribing. As a second example, in a flexible machine intended for laser processing of a wide range of material types or thicknesses, certain applications may demand significantly lower power than others. To date, most lasers that are used in such applications provide such power tuning by varying the current applied to the laser diodes between zero and the current required for maximum power, equal currents being applied to each diode.

However, the laser diodes that generate the laser power may operate best within a high power range, therefore it may be preferable to operate the laser diodes within the high power range. In such situations it may not be possible or desirable to operate the laser diodes at individual powers spanning from low power to maximum power.

In a known power tuning method, the laser system is operated at constant, full power and a variable attenuator or modulator downstream is used to attenuate the output of the laser system. However, such attenuators or modulators may not be available or reliable at the power levels or operating wavelengths of interest, and, if available, may add significant cost to the system. Additionally, attenuation or modulation of full power to lower power levels achieved in this manner wastes energy.

Accordingly, there is a need for a low-cost, reliable technique to provide broad power tuning in an energy efficient manner.

SUMMARY OF DISCLOSED EMBODIMENTS

A laser system and a power control method for controlling the laser system are provided. In one embodiment the laser system comprises diode banks configured to output laser beams, each of the diode banks including a laser diode, and the diode banks including a first diode bank and other diode banks; current controllers configured to receive current control signals corresponding to each of the diode banks and to enable current flows to the diode banks based thereon; and a control unit configured to receive an indication of a requested power and generate the current control signals based thereon, the current control signals including a first current control signal to control the first diode bank to output a first power, and other current control signals to control the other of the diode banks to output other powers, the first power being different than at least one of the other powers.

In variations of the present embodiment, the control unit is further configured to operate a diode bank of the diode banks only within a restricted power range, the restricted power range including a nominal power of one of the laser diodes. In one aspect of the present embodiment, the control unit is further configured to operate the laser diodes of the other of the diode banks in a wavelength-locked mode, wherein each of the laser diodes of the other of the diode banks are operated in a restricted power range of the laser diode including a nominal power of the laser diode, wherein the laser diodes lock reliably only in the restricted power range. In another aspect of the present embodiment, the control unit is further configured to operate the laser diodes of the other of the diode banks in a wavelength-controlled mode, wherein each of the laser diodes of the other of the diode banks are operated in a restricted power range of the laser diode including a nominal power of the laser diode, thusly generating a narrower emission band as compared to operating the laser diodes outside the restricted power range, the narrower emission band corresponding to the restricted power range. In a further aspect of the present embodiment, the control unit is further configured to operate the laser diodes of the other of the diode banks in a high-brightness mode, wherein each of the laser diodes of the other of the diode banks generate high-brightness output reliably only in a restricted power range of the laser diode including a nominal power of the laser diode, wherein operating in a high-brightness mode comprises operating only within said restricted power range. In a yet further aspect of the present embodiment, the control unit is further configured to operate the laser diodes of the other of the diode banks in a short-pulsed mode, wherein each of the laser diodes of the other of the diode banks pulse reliably within specified pulse parameters only in a restricted power range of the laser diode including a nominal power of the laser diode, wherein operating in a short-pulsed mode comprises operating only within said restricted power range. In a still further aspect of the present embodiment, wherein each of the laser diodes of the other of the diode banks operate with high electrical-to-optical efficiency within only in a restricted power range of the laser diode including a nominal power of the laser diode, the control unit is further configured to operate each of the laser diodes of the other of the diode banks only within said restricted power range.

In one embodiment the power control method is provided for a laser system comprising laser diodes arranged in diode banks, each diode bank comprising at least one of the laser diodes and having a maximum power, and the method comprises: operating a first diode bank of the diode banks to output a first power; and concurrently operating other of the diode banks to output other powers, at least one of the other powers being different than the first power.

In variations of the present embodiment, the power control method further comprises operating the laser diodes of a diode bank of the diode banks in a restricted power range, the restricted power range including a nominal power of one of the laser diodes. In one aspect of the present embodiment, the method comprises operating the laser diodes of the other of the diode banks in a wavelength-locked mode, wherein each of the laser diodes of the other of the diode banks are operated in a restricted power range of the laser diode including a nominal power of the laser diode, wherein the laser diodes lock reliably only in the restricted power range. In another aspect of the present embodiment, the method comprises operating the laser diodes of the other of the diode banks in a wavelength-controlled mode, wherein each of the laser diodes of the other of the diode banks are operated in a restricted power range of the laser diode including a nominal power of the laser diode, thusly generating a narrower emission band as compared to operating the laser diodes outside the restricted power range, the narrower emission band corresponding to the restricted power range. In a further aspect of the present embodiment, the method comprises operating the laser diodes of the other of the diode banks in a high-brightness mode, wherein each of the laser diodes of the other of the diode banks generate high-brightness output reliably only in a restricted power range of the laser diode including a nominal power of the laser diode, wherein operating in a high-brightness mode comprises operating only within said restricted power range. In a yet further aspect of the present embodiment, the method comprises operating the laser diodes of the other of the diode banks in a short-pulsed mode, wherein each of the laser diodes of the other of the diode banks pulse reliably within specified pulse parameters only in a restricted power range of the laser diode including a nominal power of the laser diode, wherein operating in a short-pulsed mode comprises operating only within said restricted power range. In a still further aspect of the present embodiment, wherein each of the laser diodes of the other of the diode banks operate with high electrical-to-optical efficiency within only in a restricted power range of the laser diode including a nominal power of the laser diode, the method further comprises operating each of the laser diodes of the other of the diode banks only within said restricted power range.

BRIEF DESCRIPTION OF THE DRAWINGS

Embodiments of the present disclosure will now be described, by way of example only, with reference to the accompanying drawings, in which.

DETAILED DESCRIPTION OF THE DRAWINGS

Figure 1:
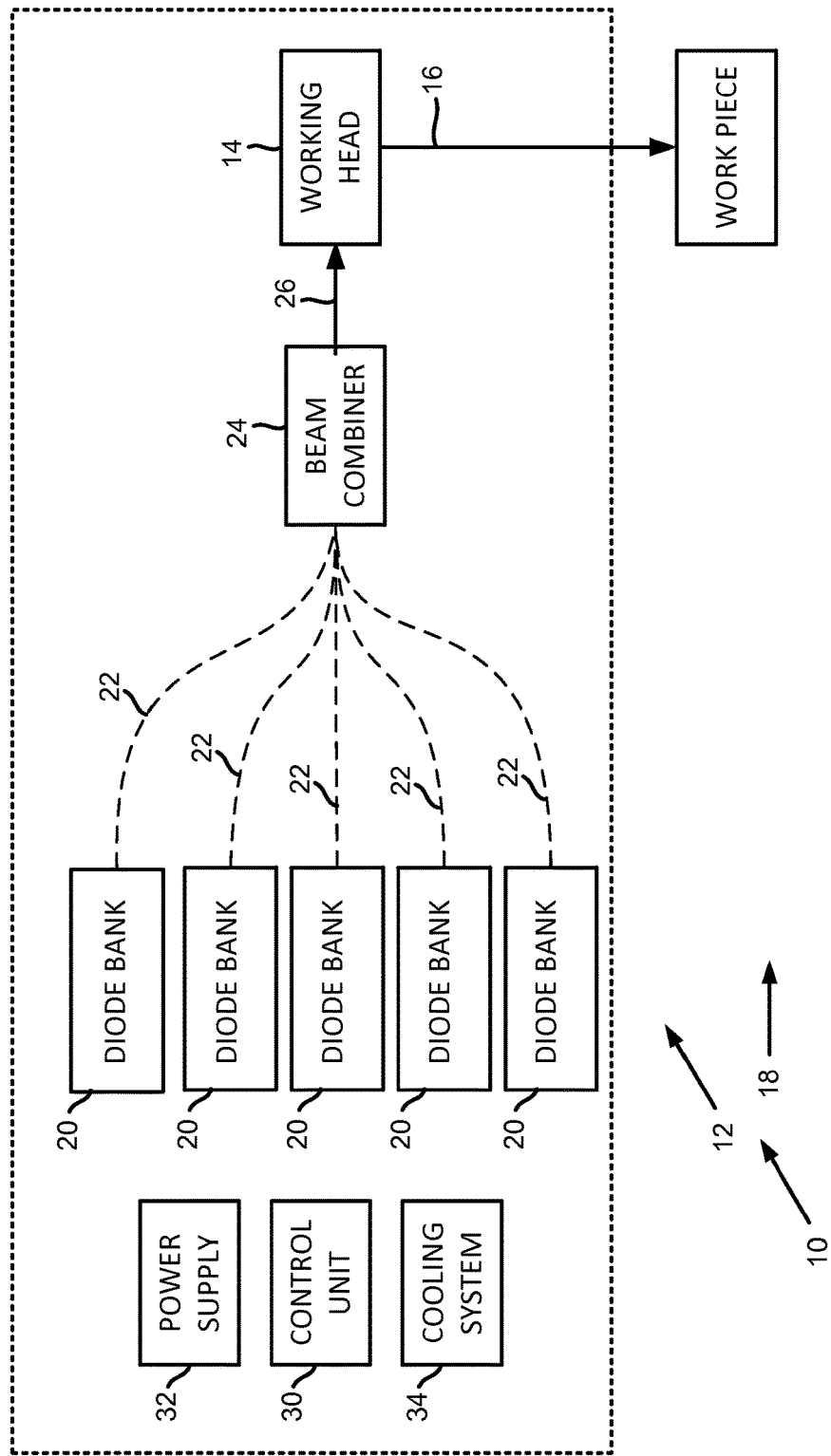
FIG. 1 is a block diagram of a laser machining apparatus comprising a laser system.

The embodiments described below are merely examples and are not intended to limit the invention to the precise forms disclosed. Instead, the embodiments were selected for description to enable one of ordinary skill in the art to practice the invention.

A laser system and a method of operating the laser system are provided herein. The laser system comprises laser diode banks. Each bank comprises at least one laser diode and may comprise multiple laser diodes connected in series. In one embodiment of the laser system, a control unit controls current flow individually to each of the banks to tune the output power of the laser system. In one variation, at least one of the banks is controlled to generate zero output power to reduce the output power of the laser system. In another variation, the banks are not individually tunable and are controlled in groups in which the group members each generate a predetermined output power (the output power is individually predetermined for each bank) to provide discrete power tuning. In a further variation, the banks are individually tuned over restricted output power ranges. In one example, one of the banks is power tunable over a broad output power range and other banks are power tunable over restricted output power ranges. In another example, one of the banks has a larger output power capacity than other banks. In a further example, one of the banks has a smaller output power capacity than other banks.

As used herein, the terms "turned on" and "turned off" refer to the output state of a diode bank. A diode bank may be turned on by application of a current to the diode bank which is greater than or equal to a threshold current necessary for lasing, and when turned on has an output power greater than zero. Conversely, a diode bank may be turned off even if a current is supplied to the diode bank if the current is less than the threshold current necessary for lasing, and when turned off has an output power substantially equal to zero.

As used herein, the term "tuning" refers to the regulation of the output power of a diode bank or a laser system. A "tunable" diode bank may be turned off or, when turned on, operated at an output power within its tuning range. The tuning range may be restricted or narrow. A "non-tunable" diode bank may be turned off or turned on, and when turned on may be operated to generate a predetermined, fixed, output power. The predetermined output power may be the nominal, optimal, maximum or any other predetermined output power. The laser system provided herein may be tunable by operation of non-tunable banks, tunable banks, and combinations thereof.

In industrial materials processing applications, such as sheet-metal cutting and welding, it is desirable to maintain a constant energy per unit length of process. In these motion-control systems, the cutting/welding head must speed up and slow down depending on the shape of the cut/weld. Even in a straight-line cut, the head speed will follow a trapezoidal curve—accelerating up to some maximum cut speed and then decelerating at the end. To maintain a constant energy per unit length, the output power of the laser must be less than full power when the head is moving at less than full speed. For example, the average power could be proportional to head speed. A combination of pulsed operation and reduced instantaneous/peak power may be used to tune the output power in relation to cutting/welding head speed, for example to deliver an equal amount of energy with each pulse, while controlling the pulse rate in relation to the head speed. Thus, dynamic control of output power is desirable, while various control parameters may be available to tune output power as desired even when diode banks are operated at constant or restricted range output power.

Figure 2:
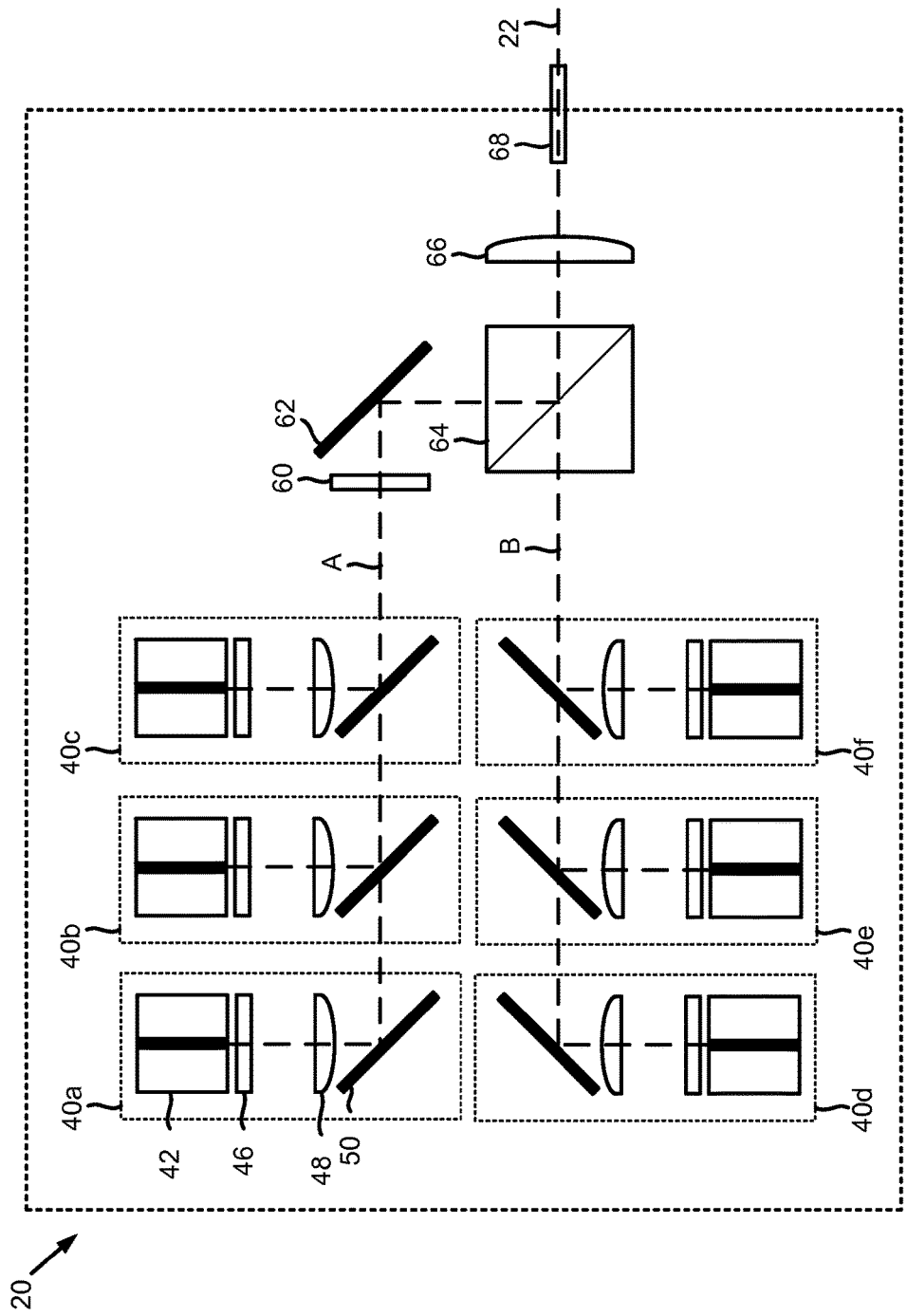
FIG. 2 is a schematic diagram depicting components of a diode bank of the laser system of FIG. 1.

FIG. 1 is a block diagram of a laser machining system 10 suitable for industrial materials processing applications and may incorporate embodiments of laser systems set forth herein and according with the invention. Laser machining system 10 comprises a laser system 12 having a working head 14 delivering a laser beam 16 to machine a work piece 18. Working head 14 is mounted on an X-Y carriage (not shown) programmed to orient laser beam 16 on a desired pattern, such as a cutting or engraving pattern. Laser system 12 comprises a plurality of diode banks 20, each of the diode banks 20 providing a laser beam 22 to a beam combiner 24. FIG. 2 depicts an example diode bank 20. Beam combiner 24 combines the beams in any manner known in the art or future developed, and outputs a combined beam 26 to working head 14. Each laser beam 22 has an output power which is regulated by a control unit 30. In one example, control unit 30 regulates power supplied by a power supply 32 into a plurality of current flows to the plurality of diode banks 20, each current flow being individually controlled by control unit 30 to cause a diode bank 20 to produce a desired output power via a laser beam 22. A cooling system 34 may be provided to circulate a cooling liquid through diode banks 20 to maintain their temperatures within desired ranges. An example control unit according with the invention is described below with reference to FIG. 4.

One specific example of a laser system suitable for industrial materials processing applications according with the invention comprises multi-mode edge emitters on single-emitter chips, each producing up to about 10 W output power. In the present example, fourteen such single emitters are mounted in each package, wired in series, with an output of about 140 W coupled into one output fiber. Each bank comprises three diode packages, or modules, wired in series. With a typical diode drop of about 1.8 V per diode, each package has a total drop of about 25 V, and thus each bank operates at about 75 V. Five individually controllable banks wired in parallel may be used in the system, providing fifteen 140 W packages in total for a total available laser diode power of 2.1 kW. The fifteen output fibers may be coupled into one larger power delivery fiber leading to the workpiece, or into a pump input port of a fiber laser.

Example laser diodes suitable for use in the embodiments disclosed herein include any of various combinations of diode types and package types, such as edge emitters or vertical cavity surface-emitting lasers (VCSELs), single-transverse-mode or multi-mode. Diode chips may include one emitter per semiconductor chip (single-emitter chips), or multiple emitters per chip (e.g. diode bars, VCSEL arrays). The chips may be packaged with one or multiple single-emitter chips inside one package or one or multiple multi-emitter chips inside one package. The laser output from the diode package, or bank, may be delivered in an optical fiber or as a free-space beam.

To generate the laser output of the diode bank, the chip outputs are combined within the diode bank. Light emitted from a high power single emitter is typically highly asymmetric resulting in long and thin emitting apertures. The light beam emitted by such lasers has much higher brightness in its "fast axis" (perpendicular to the main pin junctions) than in its "slow axis" (parallel to the active layer). An optical fiber, generally, has a substantially circular or polygonal cross-section and a substantially symmetrical acceptance angle. To obtain the highest brightness, light beams from multiple single emitter diode lasers are coupled into a single fiber stacked in their fast axis direction. For example, an array of 3-10 individual laser emitters with a 100 micrometers (um) aperture width in the slow axis can be coupled into a fiber with a 105 um diameter and 0.15 NA (numerical aperture) by stacking individual laser beams in the fast axis direction.

Since the laser diode emission is typically polarized, polarization beam combining may be used to couple light emitted by two arrays of single emitters into a single fiber, thereby doubling the power and brightness of the output beam. One example of such laser beam combining incorporates both the spatial stacking of equally polarized laser beams with polarization multiplexing of stacked beams from two laser arrays. In one example, two rows of laser diodes are positioned on an upper level, and two rows of collimating lenses are positioned on a middle level. The light beams are collimated by the lenses and then reflected by two rows of vertically offset prism mirrors positioned on a lower level, to form two vertically stacked beams that are polarization combined using a polarization beam combiner (PBC) and a half wave plate.

In another example, first and second rows of laser diodes are disposed in a staggered arrangement with a lateral offset therebetween. The present example is described in additional detail in U.S. Pat. No. 8,427,749, issued Apr. 23, 2013, which is incorporated herein by reference in its entirety and further described with reference to diode bank 20 in FIG. 2.

Referring now to FIG. 2, an example diode bank 20 comprises a plurality of diode laser subsystems 40a-f, each comprising a diode laser 42, a fast axis collimator 46, a slow axis collimator 48, and a turning reflector 50. Diode laser subsystems 40a-c generate parallel beams aligned vertically on a common plane A and vertically staggered such that a beam from one subsystem does not traverse the optical components of the other subsystems aligned on the common plane. Diode laser subsystems 40d-f are similarly arranged and aligned on a common vertical plane B. Diode bank 20 further comprises optic elements arranged to combine the laser beams from the subsystems into laser beam 22 delivered by an output fiber 68. Example optic elements comprise a polarization converter 60, a folding mirror 62, a polarization beam combiner 64, and a coupling optics 66.

In a further embodiment of a laser system and a power control method for controlling the laser system, the laser system comprises diode banks configured to output laser beams, each of the diode banks including a laser diode, and the diode banks including a first diode bank and other diode banks. The laser system also comprises a control unit configured to receive an indication of a requested power and generate current control signals based thereon, the current control signals configured to control the first diode bank at a first power and the other diode banks at other powers, the first power being different than at least one of the other powers. To receive an indication of a requested power comprises receiving a digital or an analog signal, in any manner known in the art, which comprises a value of a desired output power. To generate the current control signals based thereon comprises selecting an amount of the requested power to be output by one or more of the diode banks. Several ways of selecting the diode banks and the power to be output by each of them are described below. In one example, control logic is programmed to select the least number of diode banks whose maximum powers exceed the requested power. Thus, if each bank has a maximum capacity of 120 watts, and 580 watts are required, the control logic selects 5 banks. If the banks are configured to operate at only one power level, e.g. maximum power, the control logic may operate all 5 banks to output 600 watts. If each of the banks may be operated in a restricted power range, e.g. tunable from 70% to 100% of their maximum power, the control logic may operate each of the 5 banks at 116 watts, thus meeting the requirement while loading each bank equally. If most of the banks are configured to operate at only one power level, and at least one bank is tunable over at least 50% of its maximum range, the control logic may operate 4 banks at maximum power, and operate the tunable bank at 100 watts, thus meeting the requirement. In some embodiments, when fewer than all the banks are operated, the selection reduces the imbalance in the life-time use, or on-time, of each of the banks by tracking usage and selecting banks each time the laser system is used which have less on-time than the others, thus enhancing the life of the laser system. Various logic routines may be included in the laser system which can be used depending on how the laser system is configured. A configuration file may be included in the control unit and modified when the modular units of the laser system are selected or when an application of the laser system is selected. The configuration file may stipulate tuning ranges for the diode banks, maximum powers, and any other configuration or tuning parameter described below.

In an embodiment of the power control method, the method comprises: operating a first diode bank of the diode banks to output a first power; and concurrently operating other of the diode banks to output other powers, at least one of the other powers being different than the first power. As described previously, the first diode bank may be tunable while the other diode banks, at least some of them, may be operable at a single power output. In another example, a first diode bank is tunable over a wide power range while at least some of the other diode banks are tunable over restricted ranges. In another example, the diode banks are operable at a single output power, but one of them has a smaller maximum power than the others, therefore improving tunability of the laser system using diode banks operable with a single output power or with restricted output power ranges. Variations of the embodiments summarized in the preceding paragraphs, and others, will now be described with reference to FIGS. 3-6.

Figure 3:
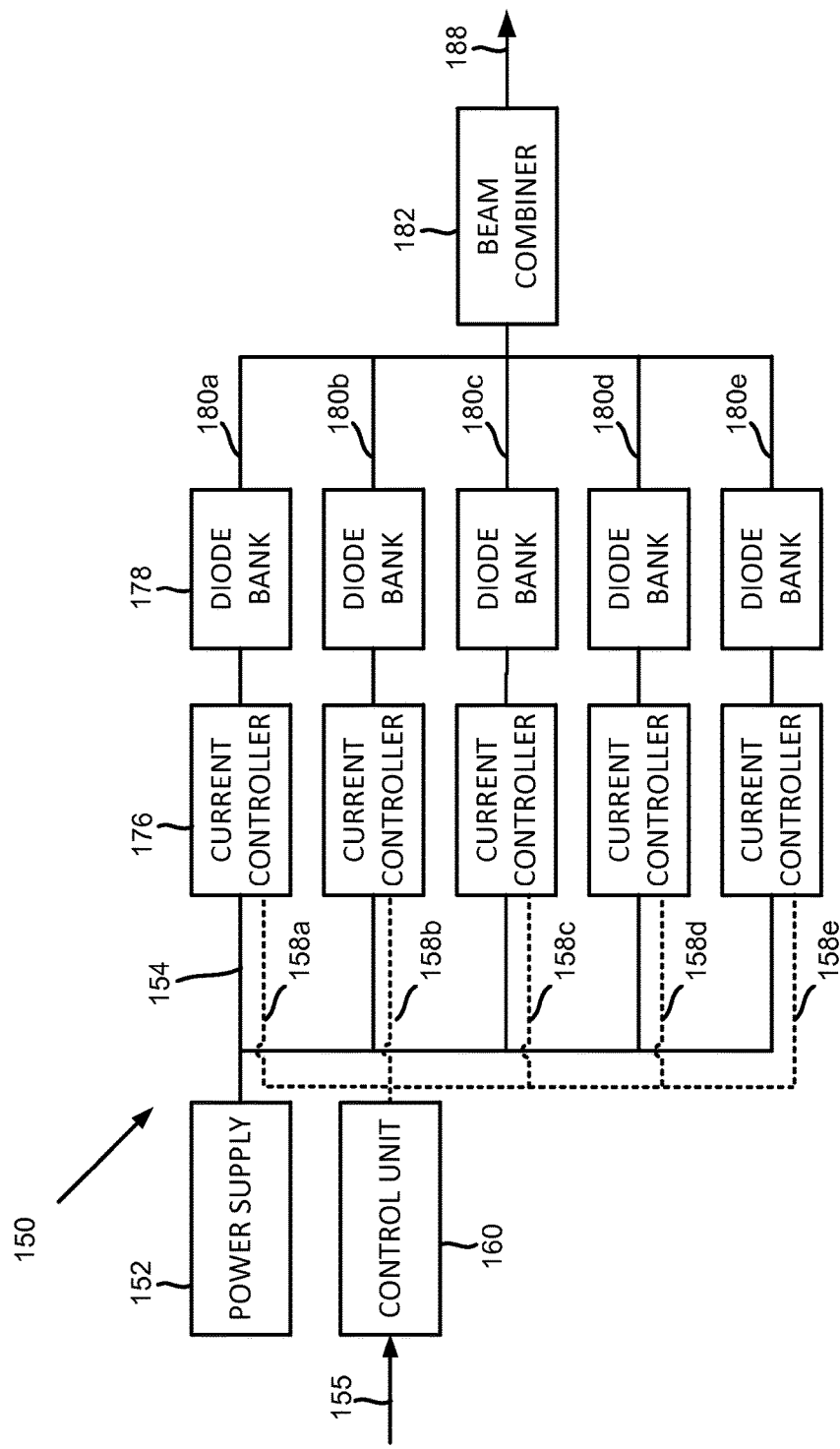
FIG. 3 is a block diagram depicting components of another embodiment of a laser system.
Figure 4:
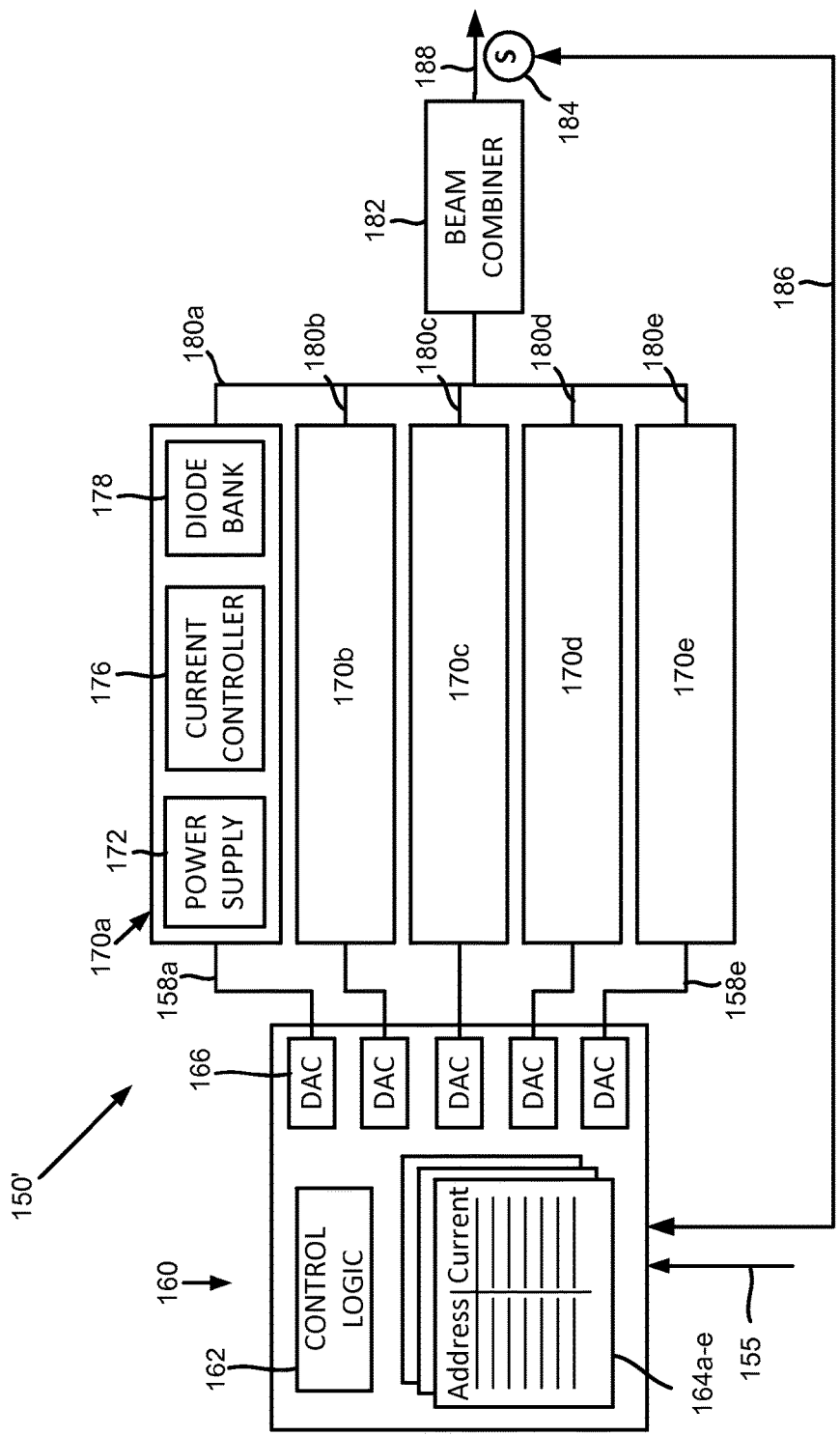
FIG. 4 is a block diagram depicting components of a further embodiment of a laser system.

FIGS. 3 and 4 are block diagrams depicting two embodiments of a laser system. Referring to FIG. 3, a laser system 150 includes a power supply 152, a control unit 160, and five current controllers 176. An indication of a requested power is transmitted to the control unit 160 via a signal conductor 155. As used herein, "requested power" refers to an amount or level of power to be output by the laser system 150. Although the present embodiment is described in the context of five current controllers and five diode banks, it should be understood that more or fewer current controllers and diode banks may be used, depending on their capacity and the desired capacity of the laser system. Each of the current controllers 176 is electrically coupled to the power supply 152 by a power conductor 154 and to the control unit 160 by one of signal conductors 158a-e. An example control unit 160 is described in detail with reference to FIG. 4. Each current controller 176 enables current flow to a diode bank 178 so that the diode bank 178 outputs an amount of power determined by the control unit 160 and transmitted via a signal conductor 158 as a current control signal for the current controller 176. Thus, each diode bank 178 can output the same or a different amount of power as any other of the diode banks 178 as determined by the control unit 160. Each diode bank 178 includes coupling optics guiding, shaping, and consolidating radiation output by the laser diodes to delivery fibers 180a-e. Exemplary coupling optics were disclosed with reference to FIG. 2. The delivery fibers 180a-e connect each of the diode banks 178 to a beam combiner 182 where the beams are combined into a system beam delivered by an output fiber 188. An exemplary current controller comprises a current source with a feedback component configured to maintain a constant current output based on the current control signal transmitted via a signal conductor. In the present embodiment, each signal conductor 158a-e provides a current control signal to a different diode bank. The output power of the laser system is the sum of the output powers of the diode banks.

Referring to FIG. 4, a laser system 150' functions as the laser system 150 and is arranged in modular units 170a-e, each modular unit including a power supply 172, a current controller 176, and a diode bank 178. The control unit 160 determines the power level to be output by each of the modular units 170a-e. In one example, each of the modular units 170a-e comprises fourteen single-emitter diodes. Although the present disclosure refers to five modular units, the number modular units, and laser diodes in the diode banks, can vary to achieve a desired power level. Thus, system 150' is easily scalable. In one variation of the present embodiment, the laser system 150' comprises between 10 and 30 modular units.

The beam combiner 182 may comprise optical elements arranged to combine the beams in various techniques known in the art. One technique comprises spatial beam combining. An example spatial beam combining technique using free-space optics to combine the beams was previously presented with reference to FIG. 2. Another example spatial beam combining technique may use a fused fiber combiner. A further technique comprises temporal combining, using for example short-pulsed diodes and fast optical switches. The aforementioned techniques, and any other technique described herein, may also be applied in combination. For example, FIG. 2 describes spatial beam combining including polarization combining. A yet further technique comprises wavelength combining, also known as wavelength-division multiplexing, wherein for example modular units 170a-e could operate at different wavelengths, possibly in wavelength-locked or wavelength-controlled operation, and a diffraction grating or array of thin-film filters could be used to combine the different wavelengths. In the case where two or more sources are wavelength multiplexed, the coupling efficiency will be determined by how much of each source's output is in the desired wavelength band. Thus the combined output power of the multiplexer will be a function not only of each sources output power but also of the coupling efficiency and hence directly depend upon the spectral characteristics of each source. If the spectral characteristics of each source change as a function of time, for example due to self-heating, then the combined output power will exhibit a temporal characteristic. A common artifact will be an increase in combined optical output power rise time due to the time required for the spectral characteristics of each source to stabilize.

The time for a source to achieve wavelength stability will depend on how closely it is operated to its nominal output power. For example, with a wavelength locked diode laser, the wavelength will lock more quickly if the laser diode is operated at 100% of its optimal/nominal power than if it were operated at 50% of its optimal/nominal output power. Thus the sources, e.g. emitters or laser diodes, in a system with n sources operated at 100% of their nominal output power will wavelength lock faster than the sources in a different system with 2*n sources operated at 50% of their nominal output power. All else being equal, the system with n sources will exhibit a shorter rise time of the combined output power. In systems where the laser is modulated, the rise time impact of slow wavelength locking can be the limiting factor in how rapidly the laser can be modulated. Thus limiting operating power to a range close to the optimal/nominal output power will result in higher possible modulation rates. In one embodiment, the diode banks tuned over a broad range, e.g. from 0% to 100% of their maximum power, achieve rise times greater (i.e. slower) than 80 μsec. The rise times may be reduced to 40 μsec or less, providing strong wavelength locking, an improvement of at least 50%, by tuning the diode banks in a restricted range comprising 70% to 100% of their maximum power. Depending on the modulation frequency, an improvement of 40 μsec may translate to a 1-5% increase in output power. More preferably the range may be further restricted to achieve rise times of 25 μsec or less while still retaining tuning capability. Of course the actual rise times and tuning ranges achievable with a particular diode bank will be affected by other variables, including the temperature of the laser system.

In some embodiments, the modulated laser system includes temperature control features to control the temperatures of the laser diodes. A diode bank may comprise a liquid cooled cold plate on which the diode lasers are mounted. A working liquid flows through the cold plate, generally at a predetermined constant flow rate and temperature sufficient to maintain a desired temperature of the laser diodes, e.g. 30° C., when they are operated to generate a continuous wave. When the modulation frequency or duty-cycle of the laser system is reduced, the amount of heat generated by the laser diodes decreases. If the predetermined flow rate and temperature is maintained, more heat will be extracted than is generated, bringing the temperature down below the desired temperature. Furthermore, when modulating the laser diodes below 100% duty-cycle it may be desirable to maintain a higher desired temperature, for example 40° C. An example temperature control feature comprises an electrically resistive element with a feedback sensor providing feedback to temperature control logic structured to maintain the temperature of the diode bank at a desired level. The resistive element may comprise a resistive layer, a ceramic resistor, or any other known electrically resistive element. The temperature control logic may comprise tables that correlate the modulation frequency to the amount of heating necessary to raise the temperature of the diode bank to a desired temperature, which may be variable as a function of modulation frequency. The correlations may be determined empirically or with an energy-balance model. Once a modulation frequency is set, a correlated amount of electrical current is provided to the resistive element to heat the cold plate.

Another example temperature control feature comprises flow control and temperature control logic structured to maintain the temperature of the diode bank at a desired level as a function of modulation frequency. Once a modulation frequency is set, the temperature control logic reduces the flow rate of the working liquid to increase the temperature of the cold plate, and vice versa. Flow may be reduced using a variable flow valve to divert some of the working liquid away from the cold plate. Flow may alternatively be reduced by controlling the duty-cycle or speed of a pump pumping the working liquid through the cold plate. In a further variation, the temperature of the working liquid may be increased at a system level by increasing the setpoint temperature of a chiller configured to cool the working liquid flowing to each of the diode banks.

In some embodiments, a feedback sensor 184 may be provided to sense a system parameter and transmit same via a feedback conductor 186 to the control unit 160. The control logic 162 comprises a closed-loop feedback portion to compare the value of a predicted system parameter to the sensed system parameter and adjust the current levels to compensate for the difference in accordance with feedback parameters, e.g. proportional, integral, and/or derivative parameters. Example system parameters include beam intensity, temperature, power, and current. Current can be measured at the output of each current controller.

The control unit 160 includes control logic structured to implement control methods described herein. The term "logic" as used herein includes software and/or firmware executing on one or more programmable processors, application-specific integrated circuits, field-programmable gate arrays, digital signal processors, hardwired logic, or combinations thereof. Therefore, in accordance with the embodiments, various logic may be implemented in any appropriate fashion and would remain in accordance with the embodiments herein disclosed. In one variation, the control unit 160 includes digital-to-analog converters (DAC) configured to output an analog control signal corresponding to a digital value. The control unit 160 also includes embedded Random Access Memory (RAM) look-up tables 164a-e depicting relationships between addresses and current levels. Each table corresponds to one DAC. Each address corresponds to an output power level. Thus, selection of an address identifies the corresponding current levels for every DAC for a given required power. In this way, the current profile of each individual bank (over the input, or required, power range) is infinitely flexible, enabling operation in accordance with any desired control algorithm or logic (including those described herein). The tables can be populated manually by a user, or automatically using a firmware and/or programmable logic based program. Since the refresh rate of the DACs is much faster than the inherent rise/fall time of the current regulator circuits, there is no need to distinguish or use different algorithms between continuous wave (CW) operation and pulsed/modulated operation, unless for optical reasons. The operating currents will simply "track" the requested power signal (i.e. follow their respective programmed profiles) to within the rise/fail capability of the regulator circuits. Stability may be increased by provision of a deadband on the requested power signal or the feedback signal to reduce current variation. The deadband may be user-programmable for added flexibility, thereby allowing a user to determine the amount of hysteresis. Tables may be re-written at any time, permitting a high degree of flexibility and customization. The tables and parameters of the closed-loop feedback may be updated periodically to reduce instances of discontinuities in output power by the laser system. Discontinuities may occur when a diode bank is turned on or off, for example. The currents may be tuned to account for response times and other factors to adjust when the diode banks are switched on and off to reduce instances of discontinuities. The tables and parameters of the closed-loop feedback may also be updated periodically to increase the power accuracy of the laser system. The power accuracy may be increased by reducing an error between the requested power and the output power of the laser system. The tables and parameters may change over time to account for aging of the laser diodes and other factors that reduce power accuracy.

In accordance with one embodiment of a tuning method, a requested power level is selected, for example by a user or a machine comprising the laser system. Control logic 162 receives an indication of the requested power via signal conductor 155 and reads corresponding current levels from the tables 164a-e. Control logic 162 then communicates the current levels to the DACs, which output analog current signals to the current controllers 176, which in turn regulate power from power supply 152, 172a-e into currents having the desired levels for the diode banks 178. The power of the diode banks may thus be regulated, or tuned. In some embodiments, the power is tuned to operate the diode banks only within restricted power ranges. It should be understood that 100% of a maximum operating power corresponds to greater than 100% of the nominal power of a diode bank, therefore a 70-100% range of the maximum power includes the nominal power. Example restricted power ranges of a diode bank include a range comprising 50-100% of the maximum power, a range comprising greater than 70% of the nominal power, a range comprising 90-110% of the nominal power, and any other range compatible with a given diode bank and operating method. The range of power within which a diode bank may be tuned is referred to as the "accessible power" and powers outside the range are referred to as "inaccessible power". Depending on the structure of the laser system, the requested power may be accessible, i.e. the laser system can be tuned to supply the requested power, or inaccessible, i.e. the laser system can only supply more or less than the requested power because there are no combinations of diode banks and restricted power ranges that can supply the requested power. As discuss below with reference to FIG. 5, for example, a combination of diode banks in a system may be tunable between 28-40% of the system's maximum output power and another combination may be tunable between 42-60%. Thus, the system's accessible power for those combinations includes 28-40% and 42-60%, and the system's inaccessible power includes 41%.

In one variation of the present embodiment, at least some of the laser diodes are operated with zero tuning range, i.e. operated to generate a predetermined output power when turned on and zero output power when turned off. In the case in which N=5 banks, and all are non-tunable, the accessible power levels would be 20%, 40%, 60%, 80%, and 100%. Nonetheless, this degree of coarse power tunability is sufficient for many applications. Table 1 depicts an example of coarse, or discrete, tunability using the tables 164*a-e* in a configuration in which all the diode banks have the same power capacity. The power levels for each of the diode banks are depicted as a percentage of capacity for illustration purposes.

TABLE 1

| System | | Output Power of Diode Banks | | | | |
|---|---|---|---|---|---|---|
| Accessible Power (%) | Table Addr: | Table 164a (Bank 1) | Table 164b (Bank 2) | Table 164c (Bank 3) | Table 164d (Bank 4) | Table 164e (Bank 5) |
| 20 | 0001 | 100% | 0% | 0% | 0% | 0% |
| 40 | 0002 | 100% | 100% | 0% | 0% | 0% |
| 60 | 0003 | 100% | 100% | 100% | 0% | 0% |
| 80 | 0004 | 100% | 100% | 100% | 100% | 0% |
| 100 | 0005 | 100% | 100% | 100% | 100% | 100% |

In a further aspect of the present variation of the present embodiment, the control logic is configured to optimize diode lifetime at the system level by periodically changing the order in which the banks turn on, which works to equalize or reduce imbalance of on-times between the banks, preventing any particular bank from accumulating more on-time than the others. "Periodically" could mean a time-based period or an event (e.g. on every power-up cycle). In one variation, the tables 164*a-e* include additional addresses and currents, which are configured to cycle which of the banks is operated for different requested powers. For example, control logic 162 can be configured with an address programmed to operate modular unit 170*b*, instead of operating modular unit 170*a*, when 20% output power is desired. Indexing logic can be provided to index the addresses after each start-up of the laser system, for example by incrementing the address of the given power level by the number of modular units.

In another variation of the present embodiment, one of the banks has a lower nominal power, or output capacity, than the others. In one example, the bank with the lowest nominal power has half the nominal power of the remaining banks. Thus, with N=5 banks, the accessible power levels vary by the capacity of the smallest capacity bank, as shown in Table 2. The tables 164*a-e* may be used to program the tuning algorithm. It should also be understood that any program or algorithm or logic, in any form thereof, may be used to program operation of the diode banks in accordance with the present disclosure.

TABLE 2

| Half-power bank on/off | Number of full-power banks on | Accessible Power |
|---|---|---|
| On | 0 | 11.1% |
| Off | 1 | 22.2% |
| On | 1 | 33.3% |
| Off | 2 | 44.4% |
| On | 2 | 55.6% |
| Off | 3 | 66.7% |
| On | 3 | 77.8% |
| Off | 4 | 88.9% |
| On | 4 | 100% |

In accordance with another embodiment of the tuning method, at least some of the diode banks 178 are operated in restricted power ranges. Each diode bank may be turned off or operated at an individualized power level within the restricted power range of the diode bank. Each bank preferably comprises a number of diodes wired in series and controlled by one current controller, thus ensuring that all the diodes in the bank are always driven with the same amount of current. The banks are preferably wired in parallel to one another and driven by one or more direct-current (DC) power supplies.

Operating the diodes of a diode bank within a restricted power range is particularly important for some specific conditions of diode operation or some specific diode designs. Wavelength-locked operation is one example. Here, the issue is that the spectral gain peak of the laser diode gain material typically has a strong temperature dependence; for GaAs-based laser diodes in the 800-1000 nm range, for example, the gain peak has a temperature coefficient of about 0.3 nm/° C. In typical high-power operation of such a laser diode, the temperature of the diode chip rises on the order of 30-40° C., thus causing a shift in the wavelength of the gain peak of about 9-12 nm. In low-power operation, for example less than 10% of maximum power, on the other hand, the temperature rises less than about 3° C., and the gain peak shifts only about 1 nm or less. In a non-locked laser diode, this gain shift is not a problem; the laser diode typically lases at approximately the gain peak under all circumstances, and so the output wavelength simply varies with power from, for example, about 930 nm at low power to about 940 nm at high power, for a laser diode that is specified for 940 nm operation at high power. Such variation is not a problem in a large number of applications.

However, in other applications such as narrow-line pumping of diode pumped solid state (DPSS) lasers and wavelength-division multiplexing of direct-laser diodes, wavelength control on the order of 1-2 nm or better may be required, and in such cases a dispersive element such as a grating is typically added to the laser-diode cavity to enforce lasing at the desired fixed wavelength. A grating may be written on the chip directly, as in the case of distributed-feedback (DFB) lasers and distributed-Bragg-reflector (DBR) lasers; or it may be external to the chip, as in the case of volume Bragg gratings (VBG's), fiber Bragg gratings (FBG's), or bulk gratings such as transmission gratings. Such gratings have a much lower temperature coefficient than GaAs and therefore typically provide wavelength control of 1-2 nm or less. However, the gain peak of the diode must still be accurately matched to the desired lasing wavelength as defined by the grating; if this is the case by design at high power, then at low power, the gain peak will be displaced from the lasing wavelength by on the order of 10 nm due to temperature variation. In GaAs lasers, the gain peak is itself on the order of 10-20 nm wide, so this shift is very significant relative to the width of the gain peak. If the laser is required to remain locked at low power, then in order for the grating to "pull" the lasing wavelength from the gain peak to the grating wavelength, it is necessary to use a higher grating strength than would otherwise have been necessary. This higher grating strength diverts more of the laser power back into the laser for locking rather than providing it as useful output power, resulting in lower output power and lower efficiency at high power than would have been necessary were it not necessary to ensure locking at low power. Thus, there is a tradeoff between locking range (and thus operating power range) and output power/efficiency. If the allowable operating power of the diode is restricted to, for example, 70% to 100% of maximum power, then the gain peak will tune by about 30%*10 nm=3 nm, which is small relative to the width of the gain peak and therefore would have little impact to the grating strength needed for reliable locking. Using multiple independently current controlled diode banks, each operated within a restricted output power range or turned off, can provide a wide range of total output power from the laser system with reduced wavelength shift due to temperature variation, thus generating a narrower emission band as compared to operating the laser diodes outside the restricted output power range to generate the same total output power.

A related example is wavelength-controlled (but non-locked) operation of a laser diode. Here, a diode is allowed to operate at its natural wavelength as determined by the gain peak, with no wavelength-locking mechanism, so that the output wavelength may vary by, for example, on the order of 9-12 nm for GaAs diodes as the power is tuned from zero to maximum power. Restricting the operating power range of the laser diode to a range of, for example, 70% 100% of maximum, reduces the output wavelength variation to about 3 nm. While this degree of wavelength control is not as tight as that enabled by wavelength locking, it is nonetheless a useful improvement for certain pumping applications, for example pumping Yb:glass, and for coarse wavelength division multiplexing in direct diode lasers. Using multiple independently current controlled diode banks, each operated within a restricted output power range or turned off, can provide more consistent thermal lens strength from the laser system over a wider range of total system output power than is possible from a similar laser system where each diode banks is operated to generate the same output power over the same (wider) range of total system output power.

Similarly, some diodes may be optimized for high-brightness operation near specific operating currents. Again the basis for this optimization is thermal in nature; a laser diode typically generates a lateral thermal gradient in high-power operation, which causes thermal lensing. A laser diode can be designed with a lateral chip design that produces a particular lateral mode quality at a particular thermal lens strength, corresponding to a specific output power level. However, at low power, the thermal lens strength drops to near zero, so a different mode quality will be observed. If the diode is optimized for a desirable mode quality at high power, then it may have worse, or unacceptable, mode quality at low power, for example leading to poor coupling efficiency into optical fiber in fiber-coupled laser diode systems. Thus, it can be advantageous in such laser diodes to restrict the operating power range to a subset of the full range, for example restricting the power range to 70% to 100% of maximum power, 70% to 100% of nominal power, or any other desirable range.

Short-pulsed laser diodes are another example of diodes that can benefit from operating within a restricted power range. Q-switching, gain switching, and mode-locking, for example, are techniques that typically generate nanosecond or shorter pulses from laser diodes by using the characteristics of the laser rate equations and optical nonlinearities. These effects depend directly on the operating power and also possibly on the chip temperature. Therefore it may not be possible or reliable to operate such diodes at powers outside of a restricted power range.

One last example of a motivation for operating diodes within a restricted power range would be with diodes that are optimized for high efficiency. Certain laser diodes are designed for optimum electrical-to-optical conversion efficiency at or near a specified operating power. Therefore, in order for the system to achieve optimum overall efficiency, it is preferred for these diodes not to operate outside of a restricted power range.

Thus, in these applications (wavelength locking, high brightness operation, short-pulsed, and high efficiency) it has been shown that it can be advantageous to operate the individual laser diode in a restricted power range. Other such applications or situations are expected to exist as well. Obtaining wide power tuning of a system that includes many such laser diodes is thus obtained advantageously by turning off some of the diodes and operating some of the diodes within their restricted power range.

Figure 5:
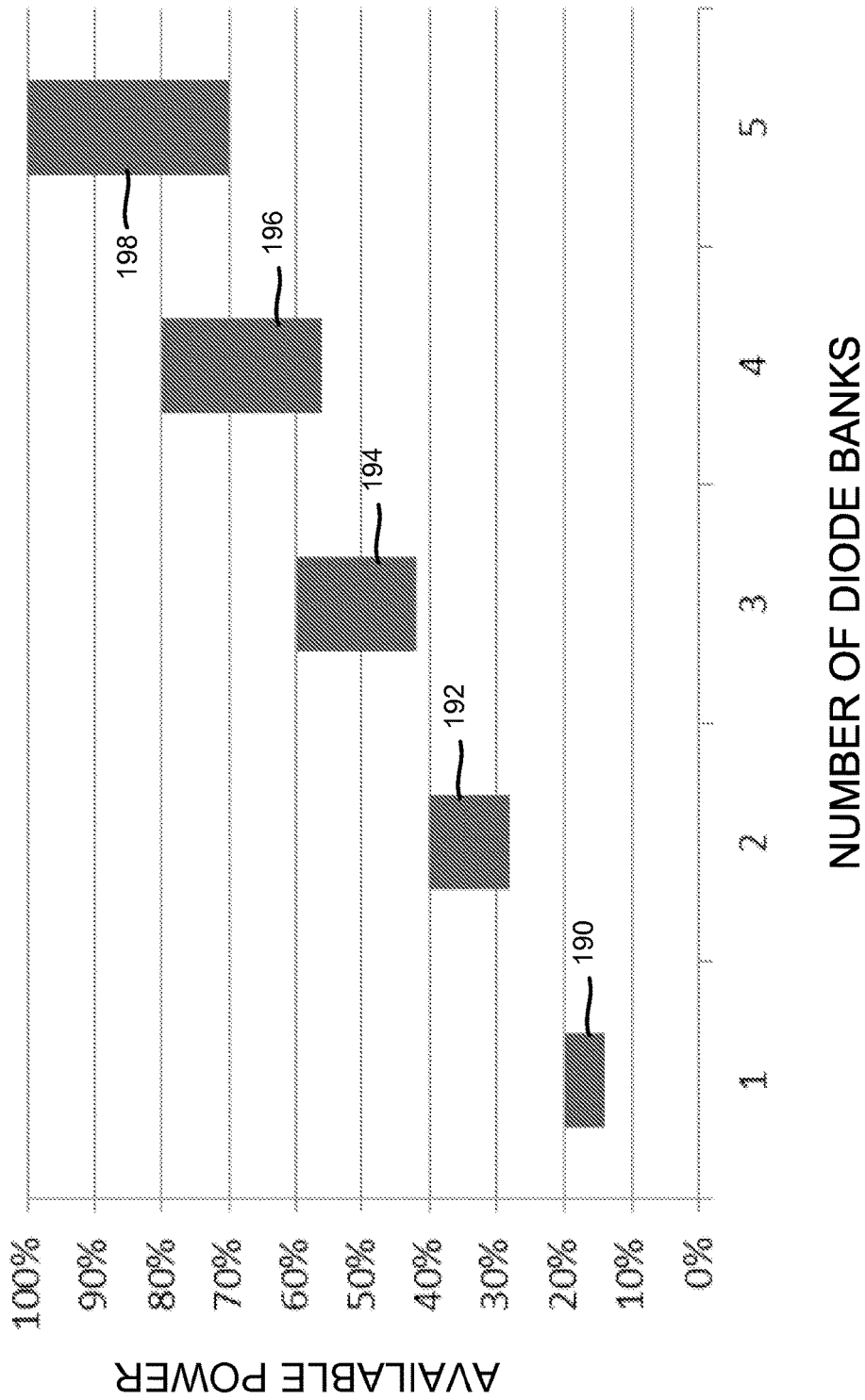
FIG. 5 is a graph depicting another embodiment of a power tuning method.

Embodiments of a restricted power range tuning method will now be described with reference to FIGS. 5 and 6. Generally, if there are N diode banks, and the diodes can be operated from X% to 100% of maximum power, then the minimum non-zero power that can be generated by the system is obtained by running one bank at its minimum allowable power, resulting in a total power of X/N % of the total system maximum power. The power can be tuned upward from this power by raising the power of that bank up to full power, and then beyond that by turning on a second bank, then a third, etc.

In one variation of the present embodiment, each of the diode banks has the same nominal power and the diodes in each bank may be operated in the same restricted range, denoted as X% of maximum power. The present variation will now be described with reference to FIG. 5, which is a bar graph denoting the output power based on the number of diode banks in operation. In the present example, X=70% and N=5. The system output power with one bank turned on will be between 70%/5, or 14%, and 100%/5, or 20%, shown as bar 190 in FIG. 5. With two banks, the system power range is 28-40%, shown as bar 192. With three banks, the system power range is 42-60%, shown as bar 194. With four banks, the system power range is 56-80%, shown as bar 196. With five banks, the system power range is 70-100%, shown as bar 198. When the power ranges overlap, as is the case between bars 194 and 196, and 196 and 198, the output power can be regulated in a continuous range, e.g. from 42% to 100%, operating three, four, and five banks.

Some power levels may be inaccessible when the power ranges do not overlap. An appropriate response may be programmed in the control unit in the event that an inaccessible power level is requested by a machine application or a user. Example appropriate responses include providing the nearest accessible power level (which may be higher or lower than the requested power level), providing the next higher accessible power level, (c) providing the next lower accessible power level, (d) providing zero power, and/or providing a warning or an error message.

When power ranges overlap, multiple numbers of banks can be used to provide the requested power level. In the above example, 75% output power could be provided using either four or five banks. Various criteria may be used to determine how many banks to use. In one form of the present embodiment, a transition power level is determined to transition from a lower number of banks to a higher number of banks. For example, four banks could be used from 60% to 75% power, and five banks could be used above 75% power. Control logic in the control unit may be structured to operate in this manner in machine applications where the power will not be continuously tuned or modulated.

Figure 6:
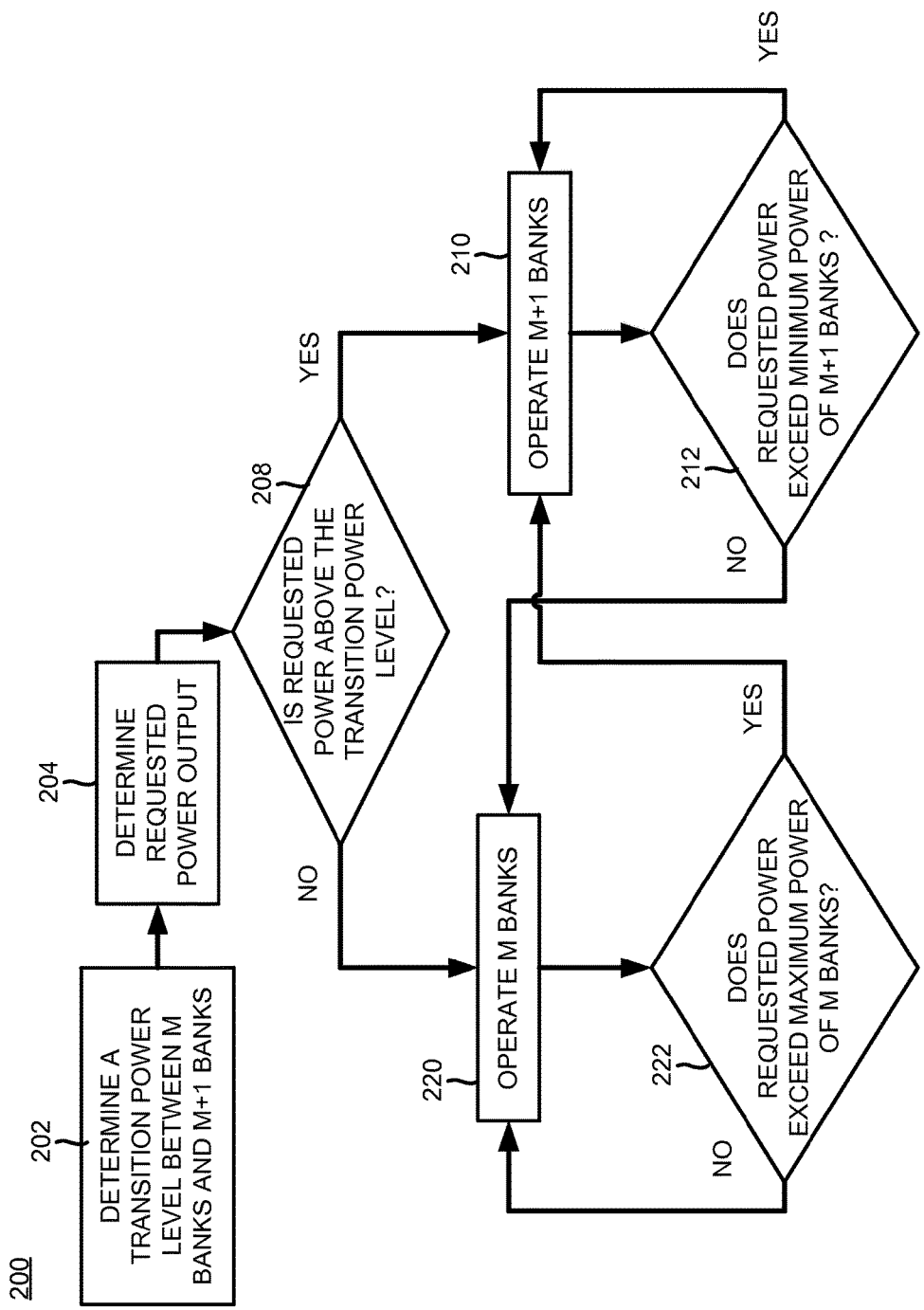
FIG. 6 is a flowchart depicting a further embodiment of a power tuning method set forth in the disclosure.

FIG. 6 is a flowchart 200 illustrative of another aspect of the present embodiment, in which hysteresis logic is provided to reduce on/off switching of banks. Hysteresis logic is advantageous when, for example, power is continuously tuned or modulated where the ranges overlap, which may cause power spikes and glitches due to frequent on/off switching of banks. Generally, a transition power level is determined to select an initial number of banks. The initial number of banks is maintained until the requested power is outside of the power range of the initial number of banks, at which time a different number of banks is operated. The method begins at 202, determining a transition power level between M banks and M+1 banks, where M+1 is less than or equal to N. The determining may be performed during configuration of the laser system once the maximum powers of the diode banks are known. The determining may also be performed during configuration of the laser system for use in a specified application, which may require never exceeding the requested power by a specified amount. The transition power level may be stored in a configuration table or file or specified memory location of the control unit. At 204 the method continues by determining a requested output power. The requested output power is determined by receiving a signal indicating the amount of desired output power, as discussed with reference to FIG. 4 in connection with signal conductor 155.

At 208 the method continues by determining if the requested output power is above the transition power level. If the requested power is above the transition power level, the method continues at 210 by operating M+1 banks. Otherwise the method continues at 220 by operating M banks. Of course, there may be multiple overlapping power ranges and transition power levels. In such case, the highest transition power level below (less than) the requested output power may be selected.

After 210, while operating M+1 banks, the method continues at 212, by determining if the requested power exceeds the minimum power of M+1 banks. If the requested output power exceeds the minimum output power of M+1 banks, the system continues operation with M+1 banks. Otherwise, the method continues at 220, by ceasing operation of one bank to operate with M banks. In this manner operation remains at M+1 banks even when the requested power is less than the transition power level, thereby delaying or preventing switching off of one bank, and reducing on and off instances of a diode bank.

After 220, while operating M banks, the method continues at 222 by determining if the requested power exceeds the maximum power of M banks. If the requested power exceeds the maximum power of M banks, the method continues at 210 by operating with M+1 banks. In this manner operation remains at M banks even when the requested power is greater than the transition power level, thereby delaying or preventing switching on an additional bank.

In an alternative aspect of the embodiment disclosed with reference to FIG. 6, the method selects the highest number of banks possible for the requested power. Thereafter, the method switches to a lower number of banks only when the requested power is less than the minimum output power of the then operating number of banks, as described with reference to 212, and switches to a higher number of banks when the requested power exceeds the maximum output power of the then operating number of banks, as described with reference to 222. Referring to FIGS. 5 and 6, for example, when oscillating between 74% and 76% power, the system operating in accordance with the foregoing aspect of the method would always use five banks. Alternatively, if the system is being turned on at 58% of the system power and then tuned continuously up to 78% and back down to 58% during a particular laser-processing operation, then the laser system would initially start with four banks (the highest number that can generate 58% in this example, the other option being three banks), and it would continue to operate four banks throughout this operation. Alternatively, if the system were to start at 58% and then tune down to 44% and then back up to 58%, then using this algorithm the system would start with four banks, transition to three banks as it passes through 56% power, and then remain at three banks down to 44% and all the way back up to 58%, thus incurring only one change in number of banks.

In another variation of the tuning method, at least one of the banks is designed to provide full power tuning. For example, the full-power tuning bank may be power tuned from 0-100% power. With the banks having equal maximum powers and the other banks having restricted or zero power tuning range, full-system power tuning from 0-100% is possible. In this case, with N=5 banks, of which four are non-tunable and one is fully tunable, powers from 0 to 20% can be generated using only the tunable bank; from 20% to 40% can be generated using one non-tunable bank plus the tunable bank; from 40% to 60% can be generated using two non-tunable banks plus the tunable bank; and so on. Of course, a bank with less than full-power tuning in combination with non-tunable banks may also provide sufficient tuning capability.

In another variation of the tuning method, the powers of the diode banks are tuned so that they are equal whenever possible, to promote uniform aging of the laser diodes. Thus, if the requested power is 480 watts and each of the five diode banks has a maximum power of 200 watts, but is tunable from 140 to 200 watts, the requested power is provided by tuning three banks to output 160 watts each instead of, for example, tuning one bank to output 200 watts and two banks to output 140 watts each. The order in which the banks are turned on may be rotated, for example by initially turning on banks 1, 2 and 3, and in another instance turning on banks 3, 4 and 5, such that over time each laser diode is utilized the same amount of time or turned on the same number of times.

While this invention has been described as having an exemplary design, the present invention may be further modified within the spirit and scope of this disclosure. This application is therefore intended to cover any variations, uses, or adaptations of the invention using its general principles. Further, this application is intended to cover such departures from the present disclosure as come within known or customary practice in the art to which this invention pertains.

What is claimed is:

1. A laser system comprising:
   diode banks configured to:
      output laser beams,
         each of the diode banks including a laser diode; and
   a control unit configured to:
      receive an indication of a requested power;
      selectively operate, based on the requested power requiring a transition from a current power level to a different power level, a plurality of the diode banks,
         a first plurality of diode banks being operated when the different power level is less than the current power level, or
         a second plurality of diode banks being operated when the different power level is greater than the current power level,
            the second plurality of diode banks including a quantity of diode banks that is greater than a quantity of diode banks included in the first plurality of diode banks; and
      operate, after selectively operating the first plurality of diode banks, the second plurality of diode banks when the requested power exceeds a maximum power of the first plurality of diode banks; or
      operate, after selectively operating the second plurality of diode banks, the first plurality of diode banks when the requested power does not exceed a minimum power of the second plurality of diode banks.

2. The laser system of claim 1, wherein, when the requested power equals a maximum power of a first diode bank of the diode banks, a first power equals the maximum power of the first diode bank, and second powers equal zero.

3. The laser system of claim 1, wherein
   each of the diode banks has a maximum power,
   the laser system has a system maximum power equal to a sum of the maximum power of each of the diode banks,
   a first current control signal is configured to tune a first diode bank, of the diode banks, over a broad range that is broader than 50% of the maximum power of the first diode bank, and
   other current control signals are configured to tune second diode banks, of the diode banks, over restricted ranges that are narrower than 50% of their respective maximum powers.

4. The laser system claim 3, wherein the broad range comprises 40% to 100% of the maximum power of the first diode bank.

5. The laser system of claim 3, wherein the restricted ranges comprise 70% to 100% of respective maximum powers of the second diode banks.

6. The laser system of claim 3, wherein the broad range comprises 10% to 100% of the maximum power of the first diode bank.

7. The laser system of claim 3, wherein the maximum power of one of the diode banks is different than the maximum power of another of the diode banks.

8. The laser system of claim 3, wherein the maximum power of the first diode bank is greater than the maximum power of each of the second diode banks.

9. The laser system of claim 1, wherein the laser system comprises a direct-diode laser.

10. The laser system of claim 1, wherein the laser diode is a single-emitter laser diode or a multi-emitter laser diode.

11. The laser system of claim 1, further comprising:
    a current controller configured to:
       receive current control signals corresponding to each of the diode banks; and
       enable current flows to the diode banks based on the current control signals.

12. The laser system of claim 10, wherein the multi-emitter laser diode comprises a laser-diode bar or a vertical cavity surface-emitting laser (VCSEL) array.

13. The laser system of claim 1, wherein the laser diode is located in a laser-diode module that includes at least two laser diodes having outputs at least one of spatially combined or polarization combined.

14. The laser system of claim 1, further comprising:
    a diode-pumped laser system coupled to a laser gain medium,
    wherein an output power of the diode-pumped laser system is configured to pump the laser gain medium,
       the laser gain medium comprises one of a fiber laser, a disk laser, a slab laser, a rod laser, a diode-pumped solid-state laser, a Raman laser, a Brillouin laser, an optical parametric laser, or an alkali-vapor laser.

15. The laser system of claim 1, wherein the diode banks include a first diode bank, second diode banks, and at least one third diode bank.

16. The laser system of claim 1, further comprising:
    a temperature control unit configured to control a temperature of the laser diode as a function of a modulation frequency.

17. The laser system of claim 16, wherein
    a first diode bank, of the diode banks, comprises a support structure on which the laser diode is mounted, and
    the temperature control unit includes an electrically resistive element coupled to the support structure and configured to heat the support structure.

18. A power control method for a laser system comprising laser diodes arranged in diode banks, each diode bank comprising at least one of the laser diodes and having a maximum power, the method comprising:
    receiving, by a control unit, an indication of a requested power;
    selectively operating, by the control unit and based on the requested power requiring a transition from a current power level to a different power level, a plurality of the diode banks,
       a first plurality of diode banks being operated when the different power level is less than the current power level, or a second plurality of diode banks being operated when the different power level is greater than the current power level,
the second plurality of diode banks including a quantity of diode banks that is greater than a quantity of diode banks included in the first plurality of diode banks; and
operating, after selectively operating the first plurality of diode banks, the second plurality of diode banks when the requested power exceeds a maximum power of the first plurality of diode banks; or
operating, after selectively operating the second plurality of diode banks, the first plurality of diode banks when the requested power does not exceed a minimum power of the second plurality of diode banks.

19. The power control method of claim 18, wherein a first power, associated with a first diode bank of the diode banks, comprises a requested power to be output by the laser system, and second powers, associated with second diode banks of the diode banks, equal zero.

20. The power control method of claim 19, wherein operating a diode bank, of the diode banks, to output zero power comprises applying a current to the diode bank which is less than a threshold current of the at least one of the laser diodes.

21. The power control method of claim 18, wherein
each diode bank has a maximum power,
the laser system has a system maximum power equal to a sum of the maximum power of each of the diode banks,
a first diode bank, of the diode banks, is tuned over a range greater than 50% of the maximum power of the first diode bank, and
second diode banks, of the diode banks, are tuned over a range comprising less than 50% of their respective maximum powers.

22. The power control method of claim 18, wherein
a range of a first diode bank, of the diode banks, comprises 0% to 100% of a maximum power of the first diode bank, and
second diode banks, of the diode banks, are tuned above 70% of their respective maximum powers.

23. The power control method of claim 18, wherein a maximum power of a first diode bank, of the diode banks, is greater than a maximum power of each of second diode banks of the diode banks.

24. The power control method of claim 18, wherein a maximum power of a first diode bank, of the diode banks, is smaller than a maximum power of each of second diode banks of the diode banks.

25. The power control method of claim 18, further comprising:
heating at least some of the laser diodes when they are off during one of pulsed or modulated operation of the diode banks.

26. The power control method of claim 18, further comprising:
operating the laser diodes of a diode bank of the diode banks only in a restricted power range, the restricted power range including a value corresponding to a nominal power of one of the laser diodes.

27. The power control method of claim 18, further comprising:
operating first laser diodes, of the laser diodes, in a wavelength-controlled mode,
wherein each of the first laser diodes are operated in a restricted power range.

28. The power control method of claim 18, further comprising:
operating first laser diodes, of the laser diodes, in a high-brightness mode,
wherein each of the first laser diodes generate high-brightness output reliably only in a restricted power range.

29. The power control method of claim 18, further comprising:
operating first laser diodes, of the laser diodes, in a short-pulsed mode,
wherein each of the first laser diodes pulse reliably within specified pulse parameters only in a restricted power range of the laser diode.

30. The power control method of claim 18,
wherein each laser diode, of a particular diode bank of the diode banks, operates with high electrical-to-optical efficiency within only in a restricted power range, and
the method further comprises:
operating each laser diode only within the restricted power range.

31. The power control method of claim 18, wherein the laser system comprises a direct-diode laser system.

32. The power control method of claim 18, wherein the laser system comprises a diode-pumped laser system coupled to a laser gain medium, the method further comprises:
pumping the laser gain medium with an output of the diode-pumped laser system, and
the laser gain medium comprises one of a fiber laser, a disk laser, a slab laser, a rod laser, a diode-pumped solid-state laser, a Raman laser, a Brillouin laser, an optical parametric laser, or an alkali-vapor laser.

33. The power control method of claim 18, wherein the laser system has accessible powers and inaccessible powers, and the method further comprises:
if the requested power includes one of the inaccessible powers, selectively:
operating the laser system to output an accessible power which is nearest the requested power;
operating the laser system to output an accessible power which is a smallest accessible power higher than the requested power;
operating the laser system to output an accessible power which is a largest accessible power lower than the requested power; or
operating the laser system to output zero power.

34. The power control method of claim 18, further comprising:
outputting at least one of a warning message or error condition information.

35. The power control method of claim 18, further comprising:
utilizing hysteresis during power tuning to reduce on and off instances of a diode bank, of the diode banks, if the requested power is modulated over a range including a tuning power limit of the diode bank and a power outside a tuning power range of the diode bank.

36. The power control method of claim 18, further comprising:
power tuning the diode banks to output a requested power,
wherein the power tuning comprises periodically changing an order in which the diode banks are turned on and off to reduce an imbalance of an on-time of the diode banks.

37. The power control method of claim 18, further comprising:

power tuning the diode banks to output a requested power, wherein power tuning comprises equalizing a first power and a second power to promote uniform aging of the laser diodes.

38. The power control method of claim 18, wherein the laser system comprises at least one of lookup-tables or a closed-loop feedback, and the method further comprises:
utilizing at least one of the lookup-tables or the closed-loop feedback to power tune the diode banks.

39. The power control method of claim 18, wherein the laser system comprises at least one of lookup-tables or a closed-loop feedback, and the method further comprises:
periodically updating at least one of the lookup-tables or parameters of the closed-loop feedback to increase power accuracy.

40. The power control method of claim 18, wherein the laser system comprises at least one of lookup-tables or a closed-loop feedback, and the method further comprises;
periodically updating at least one of the lookup-tables or parameters of the closed-loop feedback to reduce instances of discontinuities in output power by the laser system.

\* \* \* \* \*